US012690188B2

(12) United States Patent
Choi et al.

(10) Patent No.: US 12,690,188 B2
(45) Date of Patent: Jul. 21, 2026

(54) INTEGRATED CIRCUIT DEVICE

(71) Applicant: Samsung Electronics Co., Ltd.,
Suwon-si (KR)

(72) Inventors: Wonhee Choi, Suwon-si (KR); Daejin Nam, Suwon-si (KR); Sunguk Jang, Suwon-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 379 days.

(21) Appl. No.: 18/490,212

(22) Filed: Oct. 19, 2023

(65) Prior Publication Data

US 2024/0196602 A1 Jun. 13, 2024

(30) Foreign Application Priority Data

Dec. 13, 2022 (KR) ........................ 10-2022-0174181

(51) Int. Cl.
*H10B 12/00* (2023.01)
*H10D 64/27* (2025.01)
(52) U.S. Cl.
CPC ......... *H10B 12/485* (2023.02); *H10B 12/482* (2023.02); *H10B 12/488* (2023.02); *H10D 64/512* (2025.01)

(58) Field of Classification Search
None
See application file for complete search history.

(56) References Cited

U.S. PATENT DOCUMENTS

| | | | |
|---|---|---|---|
| 8,580,669 | B2 | 11/2013 | Kim |
| 8,742,375 | B2 | 6/2014 | Kawasaki |
| 8,878,293 | B2 | 11/2014 | Jang et al. |
| 9,437,697 | B2 | 9/2016 | Cho |
| 9,929,249 | B1 | 3/2018 | Ahn et al. |
| 10,644,008 | B2 | 5/2020 | Lee et al. |
| 2022/0285358 | A1 | 9/2022 | Lee |

*Primary Examiner* — Anthony Ho
(74) *Attorney, Agent, or Firm* — Harness, Dickey & Pierce, P.L.C.

(57) ABSTRACT

An integrated circuit device includes a substrate having an active region, a word line extending in the substrate in a first horizontal direction, a bit line extending on the word line in a second horizontal direction, a bit line contact electrically connecting the bit line to the active region, a doping contact connecting the bit line contact to the active region, a cell pad having a horizontal width greater than that of the active region, a buried contact that digs into one side wall of the cell pad, and a conductive landing pad facing the bit line in the first horizontal direction. The doping contact includes a first doping contact and a second doping contact, and a thickness of the first doping contact in the vertical direction is less than that of the second doping contact in the vertical direction.

20 Claims, 15 Drawing Sheets

A-A'

A-A'

A-A'

A-A'

A-A'

A-A'

A-A'

A-A'

A-A'

A-A'

INTEGRATED CIRCUIT DEVICE

CROSS-REFERENCE TO RELATED APPLICATION

This application is based on and claims priority under 35 U.S.C. § 119 to Korean Patent Application No. 10-2022-0174181, filed on Dec. 13, 2022, in the Korean Intellectual Property Office, the disclosure of which is incorporated by reference herein in its entirety.

BACKGROUND

Various example embodiments relate to an integrated circuit device.

In accordance with the rapid development of the electronics industry and demands of users, electronic devices are becoming smaller and/or lighter. Therefore, high integration is required or desired for an integrated circuit device used for an electronic device so that the design rule for components of an integrated circuit device is being reduced.

SUMMARY

Various example embodiments relate to an integrated circuit device capable of reducing resistance between a direct contact and an active region.

Furthermore, the technical challenges of the inventive concept are not limited to the technical challenges mentioned above, and other technical challenges not mentioned will be clearly understood by those skilled in the art from the description below.

According to some example embodiments, there is provided an integrated circuit device including a substrate having an active region defined by a device isolation layer, a word line crossing the active region and extending in the substrate in a first horizontal direction, a bit line extending on the word line in a second horizontal direction that is orthogonal to the first horizontal direction, a bit line contact electrically connecting the bit line to the active region, a doping contact under the bit line contact and connecting the direct contact to the active region, a cell pad arranged on the active region and having a horizontal width greater than that of the active region, a buried contact that digs into one side wall of the cell pad, and a conductive landing pad extending on the buried contact in a vertical direction and facing the bit line in the first horizontal direction. The doping contact includes a first doping contact and a second doping contact, and a thickness of the first doping contact in the vertical direction is less than that of the second doping contact in the vertical direction.

Alternatively or additionally according to some example embodiments, there is provided an integrated circuit device including a substrate having an active region defined by a device isolation layer, a word line crossing the active region and extending in the substrate in a first horizontal direction, a bit line extending on the word line in a second horizontal direction that is orthogonal to the first horizontal direction, a bit line contact electrically connecting the bit line to the active region, an insulating spacer surrounding a side wall of the bit line contact, a doping contact under the bit line contact and connecting the bit line contact to the active region, a cell pad arranged on the active region and having a horizontal width greater than that of the active region, a buried contact that digs into one side wall of the cell pad, and a conductive landing pad extending on the buried contact in a vertical direction and facing the bit line in the first horizontal direction. The doping contact includes a first doping contact and a second doping contact on the first doping contact. A thickness of the first doping contact in the vertical direction is less than that of the second doping contact in the vertical direction. The insulating spacer includes a first insulating spacer and a second insulating spacer that digs into the device isolation layer. The first insulating spacer covers the lowermost surface of the second insulating spacer and contacts one side wall of the cell pad. The second insulating spacer is between the bit line contact and the first insulating spacer.

Alternatively or additionally according to various example embodiments, there is provided an integrated circuit device including a substrate having an active region defined by a device isolation layer, a word line crossing the active region and extending in the substrate in a first horizontal direction, a bit line extending on the word line in a second horizontal direction that is orthogonal to the first horizontal direction, a bit line contact electrically connecting the bit line to the active region, an insulating spacer surrounding a side wall of the direct contact, a doping contact under the bit line contact and connecting the bit line contact to the active region, a cell pad on the active region and having a horizontal width greater than that of the active region, a conductive landing pad extending on the buried contact in a vertical direction and facing the bit line in the first horizontal direction, a capacitor structure on the bit line and electrically connected to the conductive landing pad, with the buried contact digging into one side wall of the cell pad and electrically connecting the capacitor structure to the active region. The active region is in the form of a bar extending in an oblique direction with respect to the first horizontal direction and the second horizontal direction. The insulating spacer includes a first insulating spacer and a second insulating spacer that dig into the device isolation layer. The first insulating spacer covers the lowermost surface of the second insulating spacer and contacts one side wall of the cell pad, and the second insulating spacer is between the bit line contact and the first insulating spacer. The doping contact includes a first doping contact and a second doping contact. The first doping contact includes p-type impurities, the second doping contact includes n-type impurities, and the concentration of the p-type impurities of the first doping contact is less than that of the n-type impurities of the second doping contact. A thickness of the first doping contact in the vertical direction is less than that of the second doping contact in the vertical direction.

BRIEF DESCRIPTION OF THE DRAWINGS

Various example embodiments will be more clearly understood from the following detailed description taken in conjunction with the accompanying drawings in which.

DETAILED DESCRIPTION OF VARIOUS EXAMPLE EMBODIMENTS

Hereinafter, various embodiments of the inventive concept will be described in detail with reference to the accompanying drawings. Like numeral references refer to like elements, and their repetitive descriptions are omitted.

Figure 1:
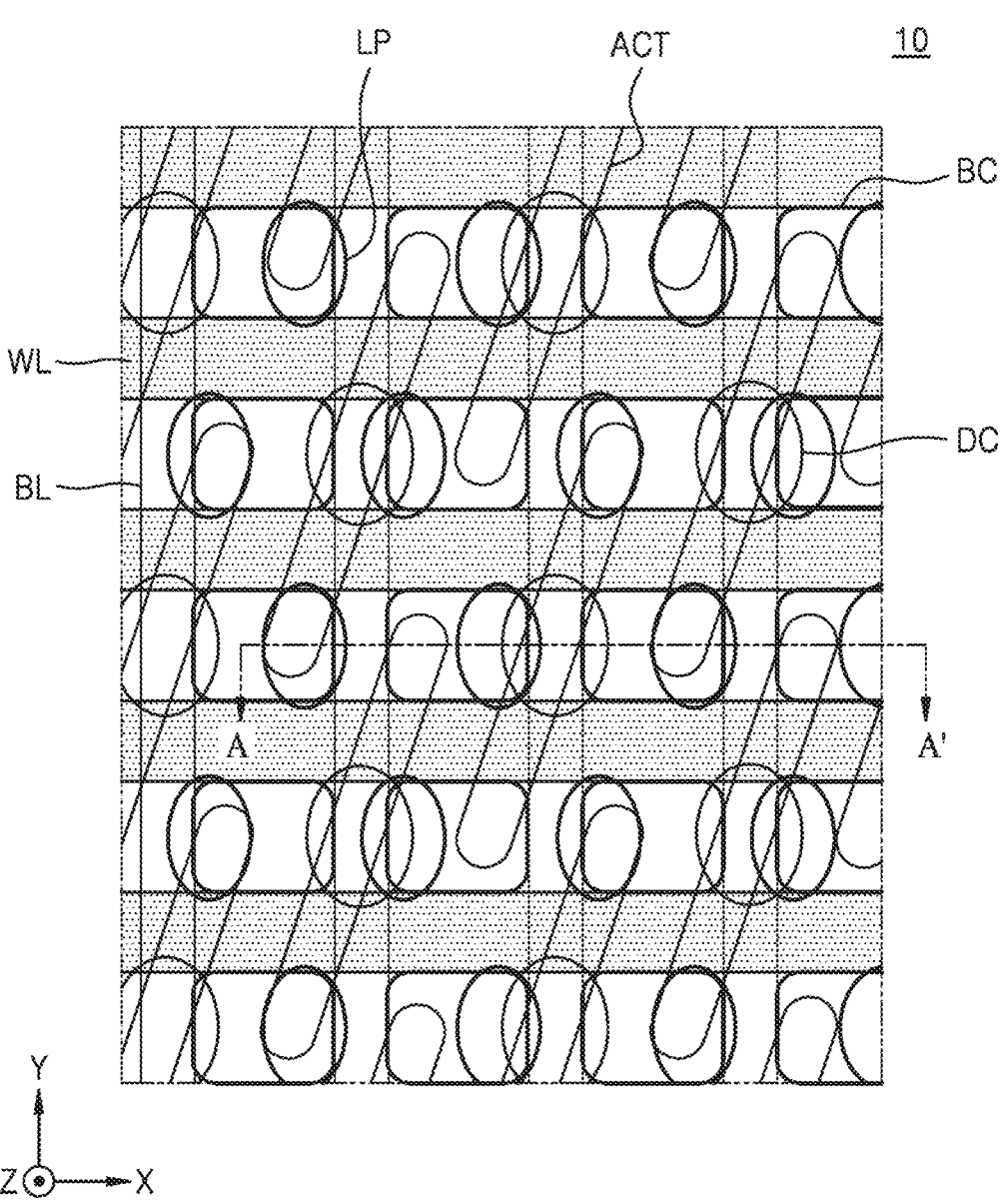
FIG. 1 is a layout diagram illustrating main components of an integrated circuit device according to some example embodiments.

FIG. 1 is a layout diagram illustrating main components of an integrated circuit device 10 according to some example embodiments.

Referring to FIG. 1, the integrated circuit device 10 may include a plurality of active regions ACT arranged to have long axes in an oblique direction with respect to a first horizontal direction (an X direction) and a second horizontal direction (a Y direction). An angle formed between the active regions ACT and the X direction may be greater than 45 degrees, and less than 90 degrees; however, example embodiments are not limited thereto.

A plurality of word lines WL may extend parallel to one another in the first horizontal direction (the X direction) across the plurality of active regions ACT. On the plurality of word lines WL, a plurality of bit lines BL may extend parallel to one another in the second horizontal direction (the Y direction) crossing the first horizontal direction (the X direction).

Each of the plurality of bit lines BL may be connected to the plurality of active regions ACT through bit line contacts, or, direct contacts DC. In some example embodiments, a plurality of buried contacts BC may each be formed between each two adjacent bit lines BL among the plurality of bit lines BL. Each of the plurality of buried contacts BC may extend to a top of one of two adjacent bit lines BL. In some example embodiments, the plurality of buried contacts BC may be arranged in a line in the first horizontal direction (the X direction) and the second horizontal direction (the Y direction).

A plurality of landing pads LP may be respectively formed on the plurality of buried contacts BC. The plurality of buried contacts BC and the plurality of landing pads LP may connect lower electrodes (not shown) of a plurality of capacitors formed on the plurality of bit lines BL to the plurality of active regions ACT. The plurality of landing pads LP may at least partially overlap the plurality of buried contacts BC, as described in detail hereinafter.

Figure 2:
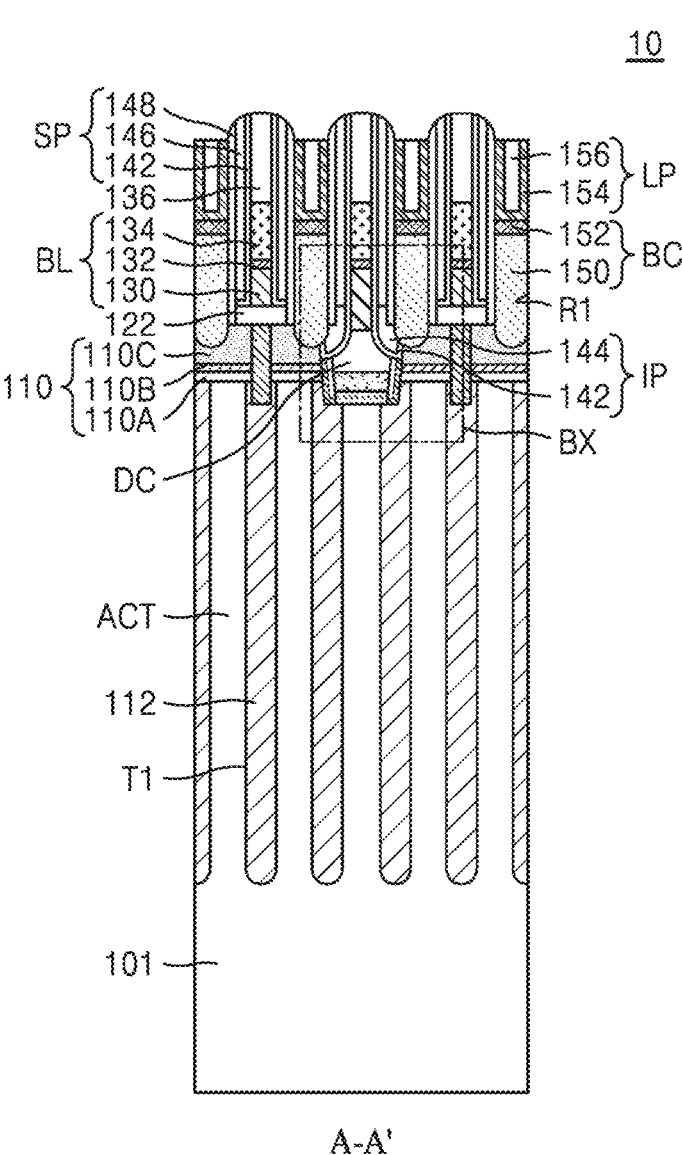
FIG. 2 is a cross-sectional view illustrating an integrated circuit device according to some example embodiments.

FIG. 2 is a cross-sectional view illustrating an integrated circuit device according to some example embodiments. Specifically, FIG. 2 is a cross-sectional view taken along the line A-A' of FIG. 1, and FIG. 3A is an enlarged view of the portion BX of FIG. 2.

Figure 3A:
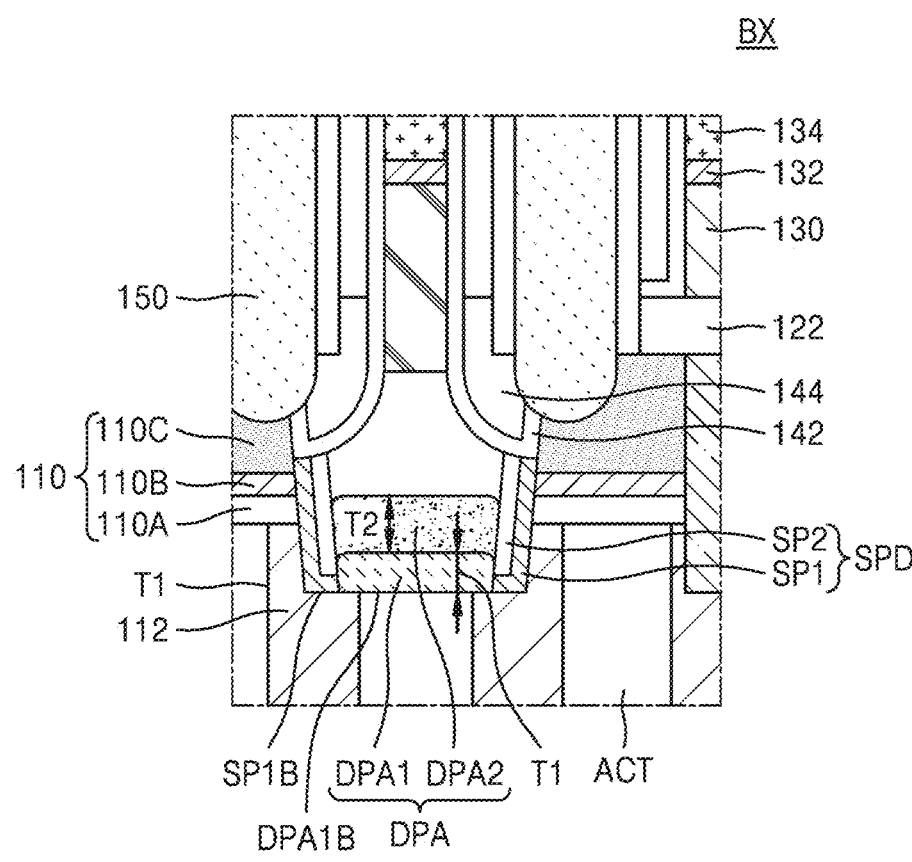
FIG. 3A is an enlarged view of the portion BX of FIG. 2, and FIGS. 3B and 3C are cross-sectional views illustrating structures of doping contacts according to some example embodiments.

Referring to FIGS. 2 and 3A, the integrated circuit device 10 may include a substrate 101 in which the plurality of active regions ACT are defined by a device isolation layer 112.

The substrate 101 may be or may include, or may be cut or diced from, a wafer including silicon (Si). Alternatively, the substrate 101 may be, include, or be cut or diced from a wafer including a semiconductor element, such as germanium (Ge), or a compound semiconductor, such as silicon carbide (SiC), gallium arsenide (GaAs), indium arsenide (InAs), or indium phosphide (InP). In some example embodiments, the substrate 101 may have a silicon on insulator (SOI) structure. The substrate 101 may include a conductive region, for example, an impurity-doped well or an impurity-doped structure.

The device isolation layer 112 may be formed in a first trench T1 that is formed in the substrate 101. The device isolation layer 112 may include silicon oxide, silicon nitride, or a combination thereof. The plurality of active regions ACT may be defined by the device isolation layer 112 in the substrate 101.

The plurality of active regions ACT may be arranged in the form of bars extending in the oblique direction with respect to the first horizontal direction (the X direction) and the second horizontal direction (the Y direction). A plurality of cell pads 110 may be respectively arranged on the plurality of active regions ACT, as described in detail below.

The plurality of word lines WL described above with reference to FIG. 1 may be buried or at least partly buried in the substrate 101. A buffer layer 122 may be formed on the substrate 101. The buffer layer 122 may cover top surfaces of the plurality of cell pads 110 and a top surface of the device isolation layer 112. The buffer layer 122 may have a stacked structure of first silicon oxide, silicon nitride, and second silicon oxide sequentially formed on the substrate 101. However, inventive concepts are not limited thereto.

A plurality of bit lines BL extending parallel to one another in the second horizontal direction (the Y direction) may be arranged on the buffer layer 122. The plurality of bit lines BL may be apart from one another in the first horizontal direction (the X direction). The direct contact DC may be arranged on a partial region of each of the plurality of active regions ACT. Each of the plurality of bit lines BL may be connected to an active region ACT through the direct contact DC. The direct contact DC may include, for example, tungsten (W), tungsten nitride (WN), cobalt (Co), nickel (Ni), aluminum (Al), molybdenum (Mo), ruthenium (Ru), titanium (Ti), titanium nitride (TiN), tantalum (Ta), tantalum nitride (TaN), copper (Cu), or a combination thereof. In some example embodiments, the direct contact DC may include doped polysilicon, e.g. polysilicon doped with one or more of boron, phosphorus, or arsenic.

Each of the plurality of bit lines BL may include a lower conductive layer 130, an intermediate conductive layer 132, and an upper conductive layer 134 sequentially formed on the substrate 101. A top surface of each of the plurality of bit lines BL may be covered with an insulation capping pattern 136. The insulation capping pattern 136 may be arranged on the upper conductive layer 134. A top surface of the lower conductive layer 130 of each of the plurality of bit lines BL may be coplanar with a top surface of the direct contact DC.

In some example embodiments, the lower conductive layer 130 may include doped polysilicon. The intermediate conductive layer 132 and the upper conductive layer 134 may include a layer including Ti, TiN, TiSiN, W, WN, WSi, WSiN, Ru, or a combination thereof. For example, the intermediate conductive layer 132 may include a TiN and/or TiSiN layer, and the upper conductive layer 134 may include a layer including Ti, TiN, W, WN, WSiN, Ru, or a combination thereof. The insulation capping pattern 136 may include silicon nitride.

A plurality of recess spaces R1 may be respectively formed in the plurality of active regions ACT in a partial region of the substrate 101. The plurality of recess spaces R1 may be respectively filled with a plurality of contact plugs 150. Each of the plurality of contact plugs 150 may be in the form of a column extending from a recess space R1 in a vertical direction (a Z direction). The plurality of contact plugs 150 may respectively contact the plurality of active regions ACT. A lower end of each of the plurality of contact plugs 150 may be at a level lower than that of a top surface of the substrate 101 so as to be buried in the substrate 101. Each of the plurality of contact plugs 150 may include one or more of a metal, a metal and a metal silicide layer, or doped polysilicon. However, example embodiments not limited thereto.

In the integrated circuit device 10 according to various example embodiments, one (or only one) direct contact DC and a pair of contact plugs 150 facing each other with the one direct contact DC therebetween may be electrically connected to different active regions ACT among the plurality of active regions ACT through the cell pads 110. For example, each of the plurality of contact plugs 150 may form a contact surface with each of the plurality of cell pads 110 having a horizontal width greater than that of each of the plurality of active regions ACT and may be directly connected to each of the plurality of cell pads 110.

The plurality of contact plugs 150 may be arranged in a line in the second horizontal direction (the Y direction) each between a pair of bit lines BL selected from the plurality of bit lines BL and adjacent to each other. An insulating fence (not shown) may be arranged between each two of the plurality of contact plugs 150 arranged in a line in the second horizontal direction (the Y direction). Each two of the plurality of contact plugs 150 may be insulated from each other by the insulating fence. For example, the insulating fence may include silicon nitride. The insulating fence may be in the form of a column extending on the substrate 101 in the vertical direction (the Z direction).

A plurality of metal silicide layers 152 and the plurality of landing pads LP may be arranged on the plurality of contact plugs 150. The plurality of landing pads LP may longitudinally extend on the plurality of contact plugs 150 in the vertical direction (the Z direction), respectively. The plurality of landing pads LP may be electrically connected to the plurality of contact plugs 150 through the plurality of metal silicide layers 152, respectively.

Each of the plurality of landing pads LP may include a conductive barrier layer 154 and a metal layer 156. In some example embodiments, the conductive barrier layer 154 may include Ti, TiN, or a combination thereof, and the metal layer 156 may include W. The plurality of landing pads LP may be in the form of a plurality of island patterns when viewed from a plane. In some example embodiments, the plurality of metal silicide layers 152 may include one or more of cobalt silicide, nickel silicide, or manganese silicide. However, inventive concepts are not limited thereto. In some example embodiments, the plurality of metal silicide layers 152 may be omitted.

The plurality of contact plugs 150 and the plurality of metal silicide layers 152 may respectively constitute the plurality of buried contacts BC. The plurality of contact plugs 150, the plurality of metal silicide layers 152, and the plurality of landing pads LP sequentially arranged on the substrate 101 may respectively constitute or be included in a plurality of contact structures electrically connected to the plurality of active regions ACT through the plurality of cell pads 110 in positions adjacent to the plurality of bit lines BL in the first horizontal direction (the X direction).

First and second side walls of each of the plurality of bit lines BL and the plurality of insulation capping patterns 136 covering top surfaces of the plurality of bit lines BL may be covered with a spacer structure SP. One (e.g. only one) spacer structure SP may be between one bit line BL selected from the plurality of bit lines BL and one of the plurality of contact plugs 150 arranged in a line in the second horizontal direction (the Y direction) in a position adjacent to the one bit line BL. Each of the plurality of spacer structures SP may include an inner spacer 142, an intermediate spacer 146, and an outer spacer 148.

The inner spacer 142 may contact a side wall of the bit line BL and a side wall of the direct contact DC. The inner spacer 142 may include a portion in contact with the contact plug 150. The inner spacer 142 may include silicon nitride.

The intermediate spacer 146 may be between the inner spacer 142 and the outer spacer 148 in the first horizontal direction (the X direction). The intermediate spacer 146 may have a side wall facing the bit line BL with the inner spacer 142 therebetween, and a side wall facing the contact plug 150, the metal silicide layer 152, and the landing pad LP with the outer spacer 148 therebetween. The intermediate spacer 146 may include silicon oxide, an air spacer, or a combination thereof.

The outer spacer 148 may contact side walls of the contact plug 150, the metal silicide layer 152, and the landing pad LP. The outer spacer 148 may be apart from the inner spacer 142 with the intermediate spacer 146 therebetween. In some example embodiments, the outer spacer 148 may include silicon nitride.

The plurality of spacer structures SP may respectively extend parallel to the plurality of bit lines BL in the second horizontal direction (the Y direction). Each of the plurality of insulation capping patterns 136 and each of the plurality of spacer structures SP may constitute or be included in an insulating structure covering the top surface and both side walls of each of the plurality of bit lines BL.

A gap-fill pattern 144 may be between the direct contact DC and the contact plug 150. The gap-fill pattern 144 may be apart from the direct contact DC with the inner spacer 142 therebetween. The gap-fill pattern 144 may surround the direct contact DC while covering both side walls of the direct contact DC. The gap-fill pattern 144 may contact the inner spacer 142 and the contact plug 150. In some example embodiments, the gap-fill pattern 144 may include silicon nitride. A structure including the inner spacer 142 and the gap-fill pattern 144 may be referred to as an insulating pattern IP.

An insulating spacer SPD may extend from a lower end of the insulating pattern IP. The insulating spacer SPD may be between the direct contact DC and the cell pad 110. The insulating spacer SPD may surround the direct contact DC. The insulating spacer SPD may contact one side wall of the cell pad 110. The insulating spacer SPD may insulate the direct contact DC from the cell pad 110.

The insulating spacer SPD may include a first insulating spacer SP1 and a second insulating spacer SP2. The first insulating spacer SP1 may contact the second insulating spacer SP2. The second insulating spacer SP2 may be arranged on an inner wall of the first insulating spacer SP1. The first insulating spacer SP1 may cover the lowermost surface of the second insulating spacer SP2. Alternatively or additionally, the first insulating spacer SP1 may contact one side wall of the cell pad 110. The second insulating spacer SP2 may be arranged between the direct contact DC and the first insulating spacer SP1.

A doping contact DPA may be arranged between the direct contact DC and the active region ACT. The doping contact DPA may electrically connect the direct contact DC to the active region ACT. The doping contact DPA may include a well doped with impurities or a structure doped with impurities.

The doping contact DPA may include a first doping contact DPA1 and a second doping contact DPA2. The first doping contact DPA1 and the second doping contact DPA2 may be sequentially stacked. For example, the second doping contact DPA2 may be arranged on (e.g. directly on) the first doping contact DPA1. Each of the first doping contact DPA1 and the second doping contact DPA2 may have a shape in which at least a part of one side wall is rounded. The first doping contact DPA1 and the second doping contact DPA2 may include impurity-doped polysilicon and/or metal. In various example embodiments, the first doping contact DPA1 may be doped with p-type impurities such as but not limited to boron, and the second doping contact DPA2 may be doped with n-type impurities such as but not limited to phosphorus and/or arsenic. In some example embodiments, a concentration of the p-type impurities with which the first doping contact DPA1 is doped may be less than that of the n-type impurities with which the second doping contact DPA2 is doped.

In some example embodiments, the first doping contact DPA1 may not include, or may include a trace concentration of, n-type impurities. In some example embodiments, the second doping contact DPA2 may not include, or may include a trace concentration of, p-type impurities. In some example embodiments, either or both of the first doping contact DPA1 and the second doping contact DPA2 may be counterdoped, e.g. may be lightly counterdoped. In some example embodiments, the first doping contact DPA1 may include a concentration of n-type impurities much less than a concentration of p-type impurities. Alternatively or additionally, in some example embodiments, the second doping contact DPA2 may include a concentration of p-type impurities much less than a concentration of n-type impurities. There may not be or there may be minimal or reduced solid-phase diffusion between the first doping contact DPA1 and the second doping contact DPA2.

In some example embodiments, a concentration of impurities in the first doping contact DPA1 and/or the second doping contact DPA2 may be determined with various analytical techniques, such as but not limited to secondary ion mass spectrometry (SIMS) such as a time-of-flight SIMS (TOF-SIMS); however, example embodiments are not limited thereto.

In some example embodiments, there may be a junction between the first doping contact DPA1 and the second doping contact DPA2. In some example embodiments, there may be a diode formed between the first doping contact DPA1 and the second doping contact DPA2. In some example embodiments, the diode may be formed such that leakage current is prevented or reduced, and the integrated circuit may operate more efficiently and/or at a higher speed and/or at a lower power consumption. Alternatively or additionally in some example embodiments, a resistance between the direct contact DC and the active region ACT may be reduced, for example based on the first doping contact DPA1 and the second doping contact DPA2. For example, diffusion of various impurities may be mitigated.

The first doping contact DPA1 may contact a top surface of the active region ACT. The second doping contact DPA2 may be arranged between the direct contact DC and the first doping contact DPA. In some example embodiments, a thickness T1 of the first doping contact DPA1 in the vertical direction (the Z direction) may be less than a thickness T2 of the second doping contact DPA2 in the vertical direction (the Z direction). A horizontal width of the first doping contact DPA1 in the first horizontal direction (the X direction) may be less than or equal to a horizontal width of the second doping contact DPA2 in the first horizontal direction (the X direction). Alternatively or additionally, both the horizontal width of the first doping contact DPA1 in the first horizontal direction (the X direction) and the horizontal width of the second doping contact DPA2 in the first horizontal direction (the X direction) may be greater than a horizontal width of the active region ACT in the first horizontal direction (X direction).

A side wall of the first doping contact DPA1 may contact a side wall of the first insulating spacer SP1 and a side wall of the second insulating spacer SP2, and a side wall of the second doping contact DPA2 may contact a side wall of the second insulating spacer SP2. A level of the lowermost surface DPA1B of the first doping contact DPA1 may be the same as that of, e.g., may be coplanar with, the lowermost surface SP1B of the first insulating spacer SP1.

Although not shown, a plurality of memristors and/or capacitors may be respectively arranged on the plurality of landing pads LP. The plurality of memristors and/or capacitors may include a plurality of lower electrodes, a capacitor dielectric layer, and an upper electrode. The capacitor dielectric layer may cover the plurality of lower electrodes. The upper electrode may cover the capacitor dielectric layer and may face the plurality of lower electrodes with the capacitor dielectric layer therebetween.

In some example embodiments, the contact plug 150 may be formed by digging or etching into one side wall of the cell pad 110. Accordingly, at least a part of one side wall of the cell pad 110, which contacts the contact plug 150, may have a rounded shape, and the other side wall of the cell pad 110, which does not contact the contact plug 150, may have a vertical shape. Alternatively or additionally, as described above, the insulating pattern IP may surround both side walls of the direct contact DC and may contact the cell pad 110.

The cell pad 110 may include a first pad 110A, a second pad 110B, and a third pad 110C. The first pad 110A, the second pad 110B, and the third pad 110C may be sequentially stacked on the substrate 101. The first pad 110A may include doped polysilicon. The second pad 110B may include a metal. The third pad 110C may include a metal including a conductive material, which may or may not be the same as the second pad 110B. Here, the contact plug 150 may include a metal that is substantially the same material as the third pad 110C. In some example embodiments, the contact plug 150 may be in direct contact with the third pad 110C. In some example embodiments, the cell pad 110 may further include a metal silicide layer (not shown) between the first pad 110A and the second pad 110B.

Figure 3B:
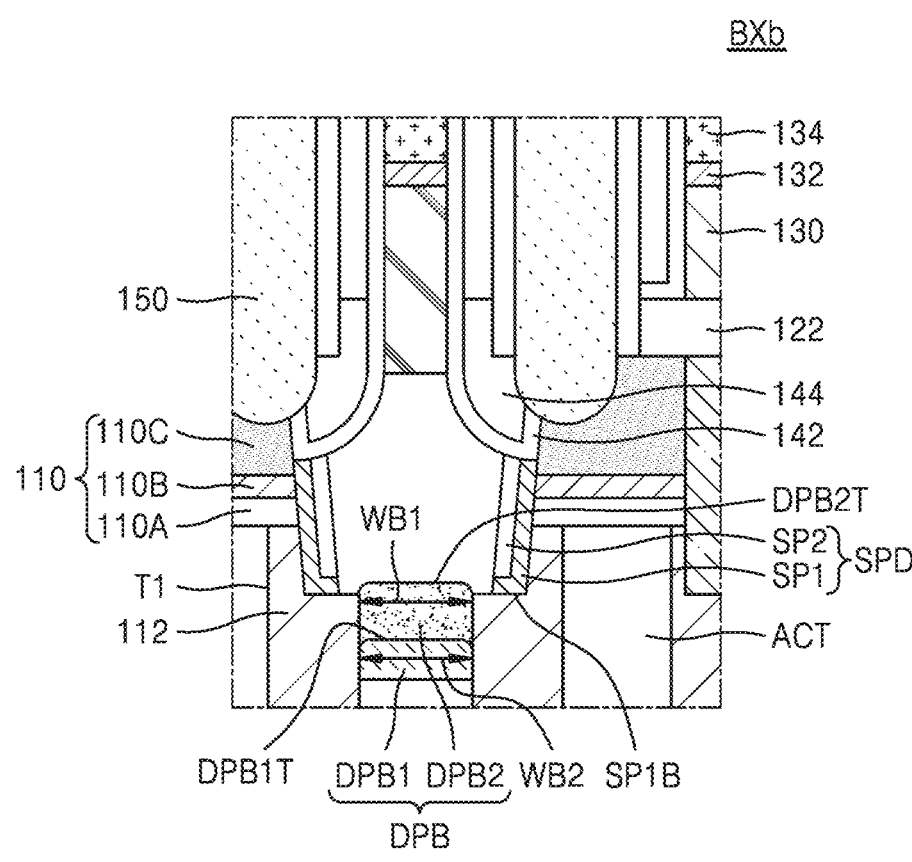
Figure 3C:
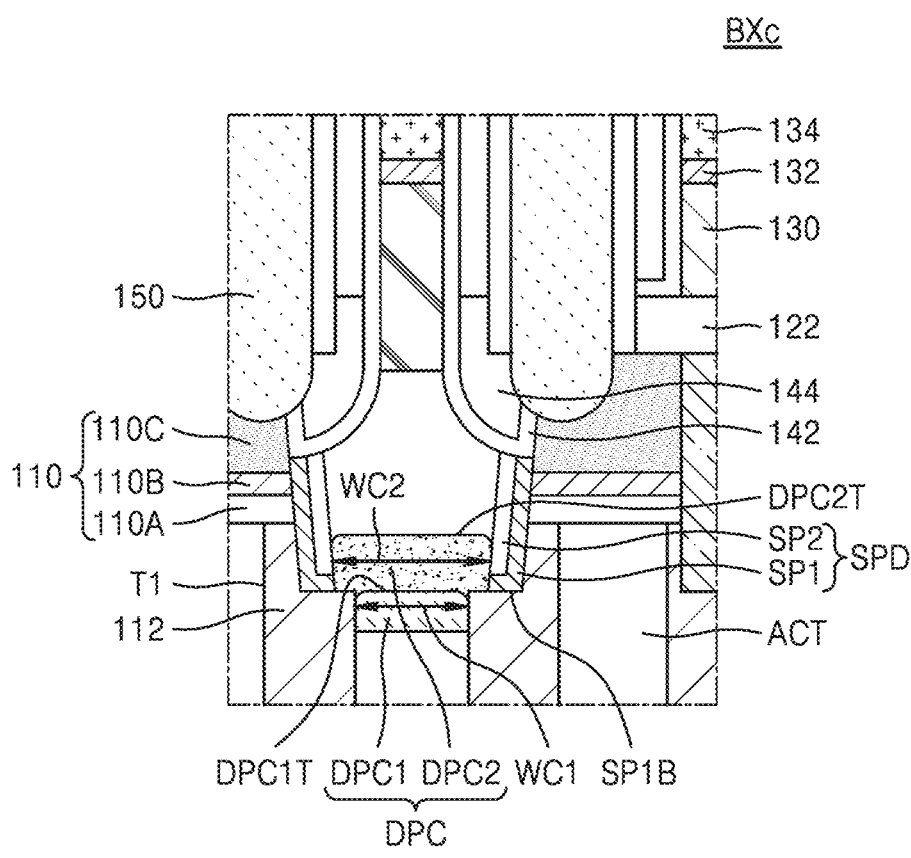

FIGS. 3B and 3C are cross-sectional views illustrating structures of doping contacts according to some example embodiments. Specifically, FIGS. 3B and 3C illustrate enlarged portions BXb and BXc of the portion BX according to some example embodiments, which are different from FIG. 3A. In FIGS. 3B and 3C, description previously given with reference to FIGS. 1 to 3A is simply given or omitted. In particular, differences from FIG. 3A are mainly described.

In addition, the integrated circuit devices illustrated in FIGS. 3B and 3C may be similar to the structure of the integrated circuit device 10 illustrated in FIG. 2, except that the integrated circuit device illustrated in FIG. 3B includes a direct contact DC and a doping contact DPB and the integrated circuit device illustrated in FIG. 3C includes a direct contact DC and a doping contact DPC. Description of the components of the embodiment may refer to descriptions of the same or similar components of the integrated circuit device 10 illustrated in FIGS. 1 and 2 unless otherwise stated.

Referring to FIG. 3B, the doping contact DPB may include a first doping contact DPB1 and a second doping contact DPB2. A horizontal width WB1 of the first doping contact DPB1 in the first horizontal direction (the X direction) may be equal to a horizontal width WB2 of the second doping contact DPB2 in the first horizontal direction (the X direction). Each of the horizontal width WB1 of the first doping contact DPB1 in the first horizontal direction (the X direction) and the horizontal width WB2 of the second doping contact DPB2 in the first horizontal direction (the X direction) may be equal to the horizontal width of the active region ACT in the first horizontal direction (the X direction).

In various example embodiments, the first doping contact DPB1 and the second doping contact DPB2 may be disposed to be spaced apart from the first insulating spacer SP1 and the second insulating spacer SP2 in the first horizontal direction (X direction). In some example embodiments, the first doping contact DPB1 and the second doping contact DPB2 may not contact the first insulating spacer SP1 and the second insulating spacer SP2. In some example embodiments, each of the first doping contact DPB1 and the second doping contact DPB2 may contact the device isolation layer 112.

In various example embodiments, a level of the uppermost surface DPB1T of the first doping contact DPB1 may be lower than that of the lowermost surface SP1B of the first insulating spacer SP1. In some example embodiments, a level of the uppermost surface DPB2T of the second doping contact DPB2 may be higher than that of the lowermost surface SP1B of the first insulating spacer SP1.

Referring to FIG. 3C, the doping contact DPC may include a first doping contact DPC1 and a second doping contact DPC2. A horizontal width WC1 of the first doping contact DPC1 in the first horizontal direction (the X direction) may be less than a horizontal width WC2 of the second doping contact DPC2 in the first horizontal direction (the X direction). The first doping contact DPC1 may not contact the first insulating spacer SP1 and the second insulating spacer SP2. The second doping contact DPC2 may contact the first insulating spacer SP1 and the second insulating spacer SP2.

In some example embodiments, a level of the uppermost surface DPC1T of the first doping contact DPC1 may be the same as that of the lowermost surface SP1B of the first insulating spacer SP1. Alternatively or additionally in some example embodiments, a level of the uppermost surface DPC2T of the second doping contact DPC2 may be higher than that of the lowermost surface SP1B of the first insulating spacer SP1 Alternatively or additionally in some example embodiments, the level of the uppermost surface DPC2T of the second doping contact DPC2 may be lower than that of the lowermost surface of the cell pad 110. In embodiments, the first doping contact DPC1 may contact the device isolation layer 112. A part of a bottom surface of the second doping contact DPC2 may contact the device isolation layer 112. In some example embodiments, another part of the bottom surface of the second doping contact DPC2 may contact the first doping contact DPC1.

FIGS. 4, 5, 6, 7A, and 7B are views illustrating a method of manufacturing an integrated circuit device, according to some example embodiments, in a process order. In FIGS. 3B and 3C, description previously given with reference to FIGS. 1 to 3A is simply given or omitted.

Figure 4:
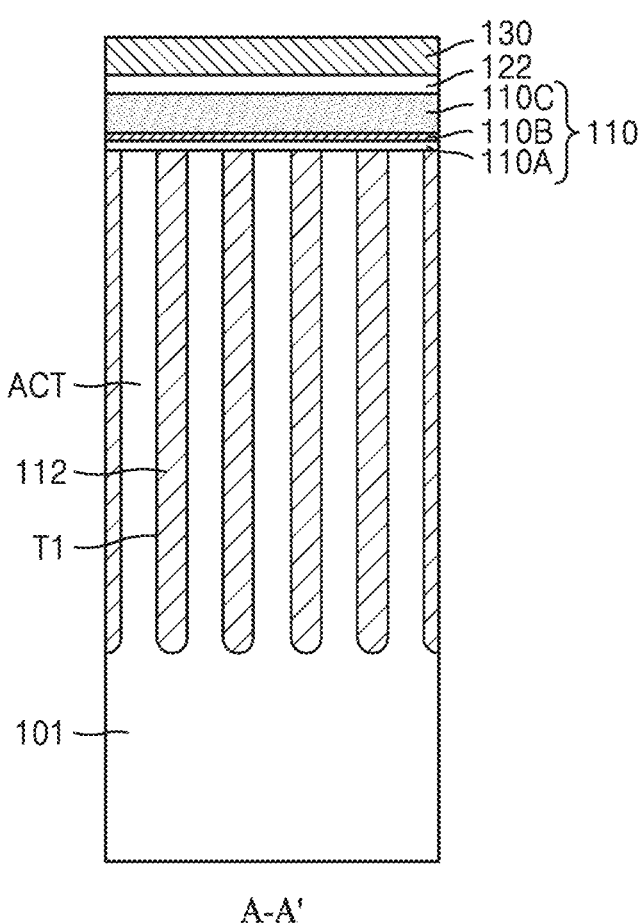
FIGS. 4, 5, 6, 7A, and 7B are views illustrating a method of manufacturing an integrated circuit device, according to some example embodiments, in a process order.

Referring to FIG. 4, a mask (not shown) is formed on the substrate 101 through a photolithography process, and a first trench T1 is formed in the substrate 101 by using the mask, for example by etching the substrate. The mask may include a plurality of bar shapes extending in an oblique direction with respect to the first horizontal direction (the X direction) and the second horizontal direction (the Y direction). The shape of the mask may correspond to a planar shape of the active region ACT. The mask may include an insulating material. For example, the mask may include SiN, SiO, SiON, SiOC, metal oxide, or a combination thereof. The mask may be a hardmask; however, example embodiments are not limited thereto.

Before the mask is formed, a protective insulating layer (not shown) may be formed on the top surface of the substrate 101. The protective insulating layer may protect or help to protect the substrate 101 or the active region ACT against external foreign materials. Alternatively or additionally, the protective insulating layer may act as an etch stop layer in an etching process for another series of material layers in a subsequent process. The mask may be formed on the protective insulating layer, and the first trench T1 may be formed in the substrate 101 to pass through the protective insulating layer. Although a width of the first trench T1 is illustrated as being constant at the top and bottom, the width of the first trench T1 may be less toward the bottom due to a characteristic of a dry etching process. Accordingly, a side wall of the first trench T1 may not be vertical and may have a tapered shape having a fine inclination.

Here, the device isolation layer 112 may be formed by filling the first trench T1 with an insulating material such as with a shallow trench isolation (STI) process. The device isolation layer 112 may have a structure varying in accordance with a horizontal width of the first trench T1. The mask may be removed by a dry etching process or a wet etching process. In addition, the protective insulating layer may be removed by a cleaning process and/or an etching process. The cell pad 110, the buffer layer 122, and the lower conductive layer 130 may be sequentially stacked on the substrate 101.

Figure 5:
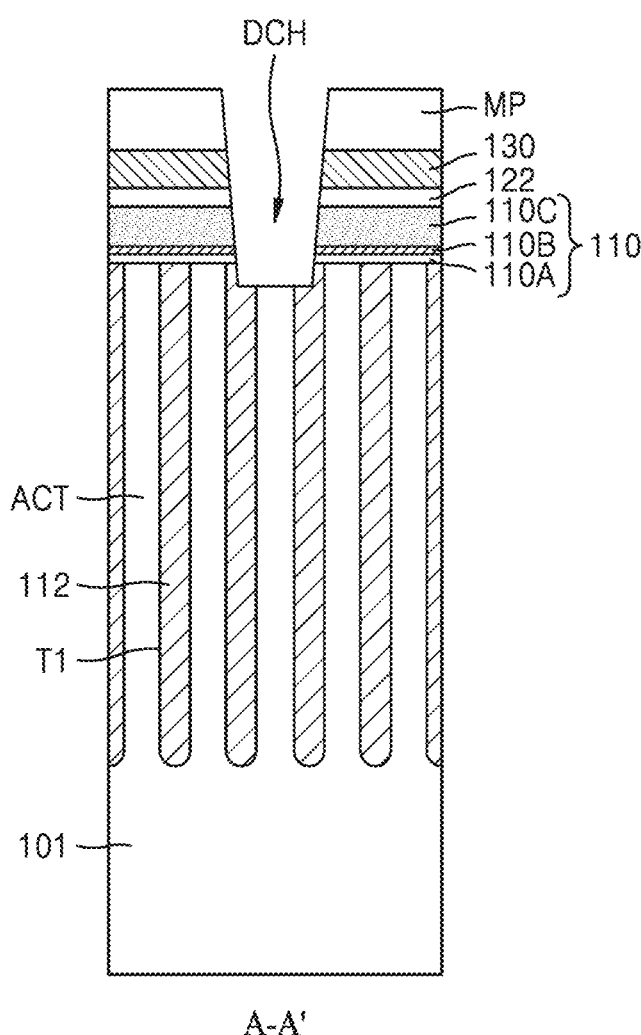

Referring to FIG. 5, a mask pattern MP is formed on the lower conductive layer 130 by a photolithography process.

The mask pattern MP may be formed of a material that may be removed, e.g. may be relatively easily removed by an ashing and stripping process. For example, the mask pattern MP may be formed of photoresist and/or a material having a high carbon content, such as a spin on hard mask (SOH). The mask pattern MP may include an open region (not shown) exposing a portion corresponding to a central portion of the active region ACT. A central part of the active region ACT exposed through the open region may correspond to a portion in which the direct contact DC (refer to FIG. 2) is to be formed.

A direct contact hole DCH exposing the active region ACT of the substrate 101 may be formed by partially etching the lower conductive layer 130 exposed through the open region and the substrate 101, the device isolation layer 112, the cell pad 110 and the buffer layer 122 under the lower conductive layer 130 by using the mask pattern MP as an etching mask.

Figure 6:
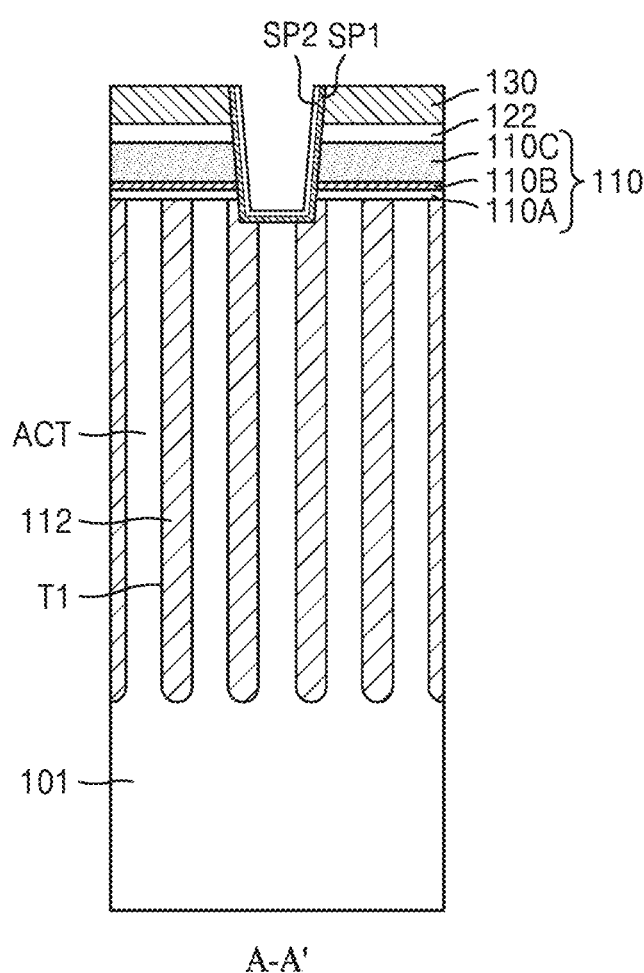

Referring to FIG. 6, the first insulating spacer SP1 and the second insulating spacer SP2 may be sequentially formed in the direct contact hole DCH. The first insulating spacer SP1 and the second insulating spacer SP2 may be tapered along the direct contact hole DCH, and may be formed with a conformal deposition process such as a chemical vapor deposition (CVD) process and/or a physical vapor deposition (PVD) process. In some example embodiments, an upper surface of the first insulating spacer SP1 and the second insulating spacer SP2 may be removed, e.g., with a planarization process such as but not limited to a chemical mechanical planarization (CMP) process and/or an etch-back process; however, example embodiments are not limited thereto.

Figure 7A:
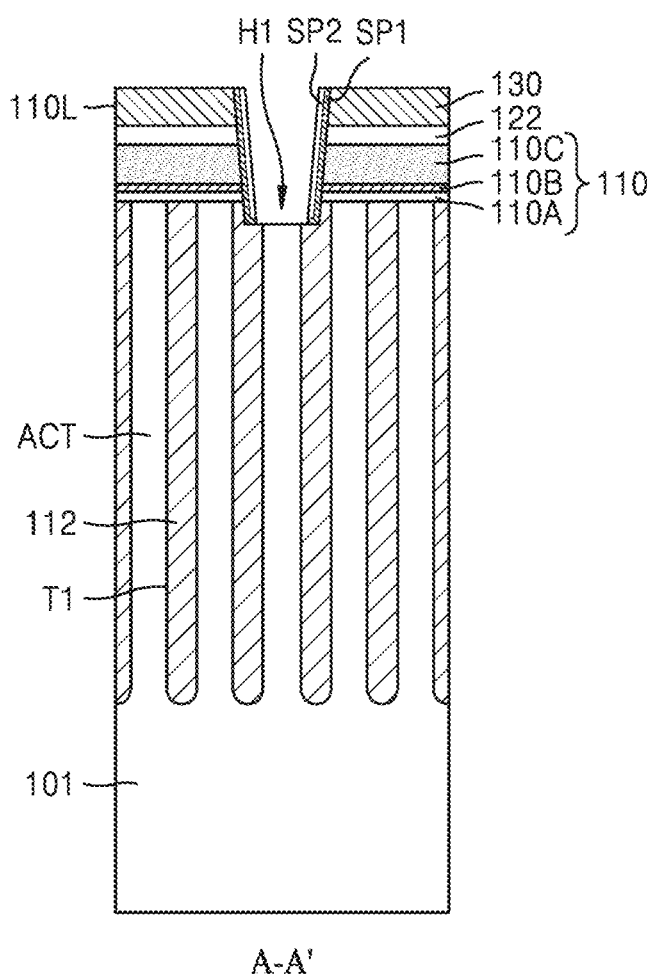
Figure 7B:
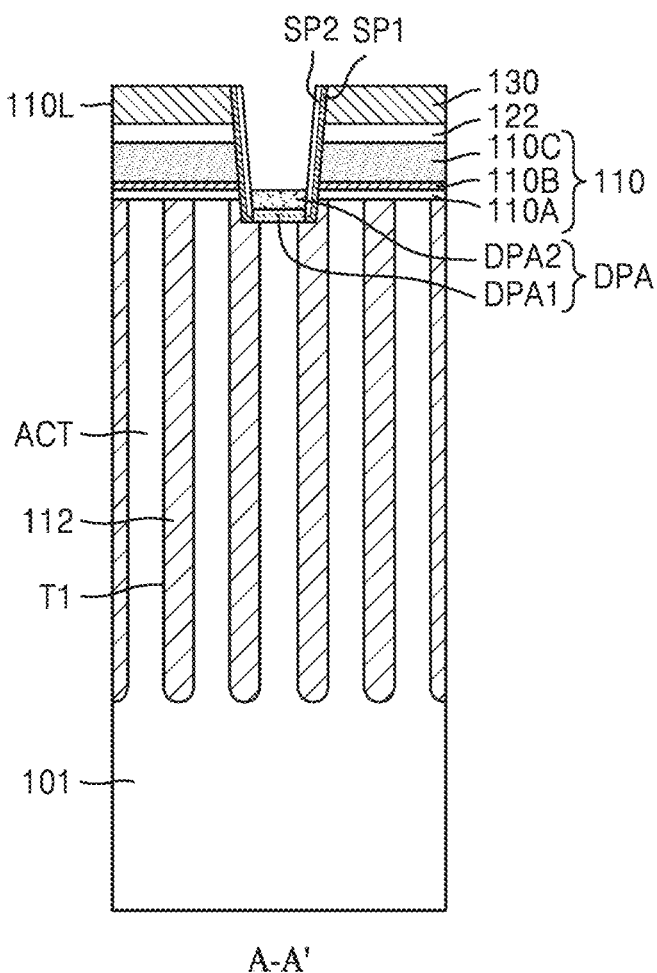

Referring to FIGS. 7A and 7B, a first hole H1 may be formed by partially etching the first insulating spacer SP1 and the second insulating spacer SP2. A level of the lowermost surface of the first hole H1 may be the same as that of the lowermost surface of the direct contact hole DCH of FIG. 5. Here, the active region may act as an etching stop layer in an etching process. After the first hole H1 is formed, the first doping contact DPA1 and the second doping contact DPA2 may be formed in the first hole H1. The first doping contact DPA1 and the second doping contact DPA2 may be formed in the first hole H1 by using an epitaxial growth process, such as a heterogeneous and/or a homogenous epitaxial growth process. The first doping contact DPA1 and the second doping contact DPA2 may be sequentially stacked on the active region ACT.

In some example embodiments, the first doping contact DPA1 and/or the second doping contact DPA2 may be formed by incorporating dopants into the epitaxial growth. Alternatively or additionally, in some example embodiments the first doping contact DPA1 and/or the second doping contact DPA2 may be implanted with impurities acting as dopants into the respective first doping contact DPA1 and the second doping contact DPA2. In some example embodiments, the second doping contact DPA2 may be deposited onto the first doping contact DPA1, and subsequently a first impurity may be doped into the first doping contact DPA1 at a first energy, and a second impurity may be doped into the second doping contact DPA2 at a second energy; however, example embodiments are not limited thereto.

Figure 8A:
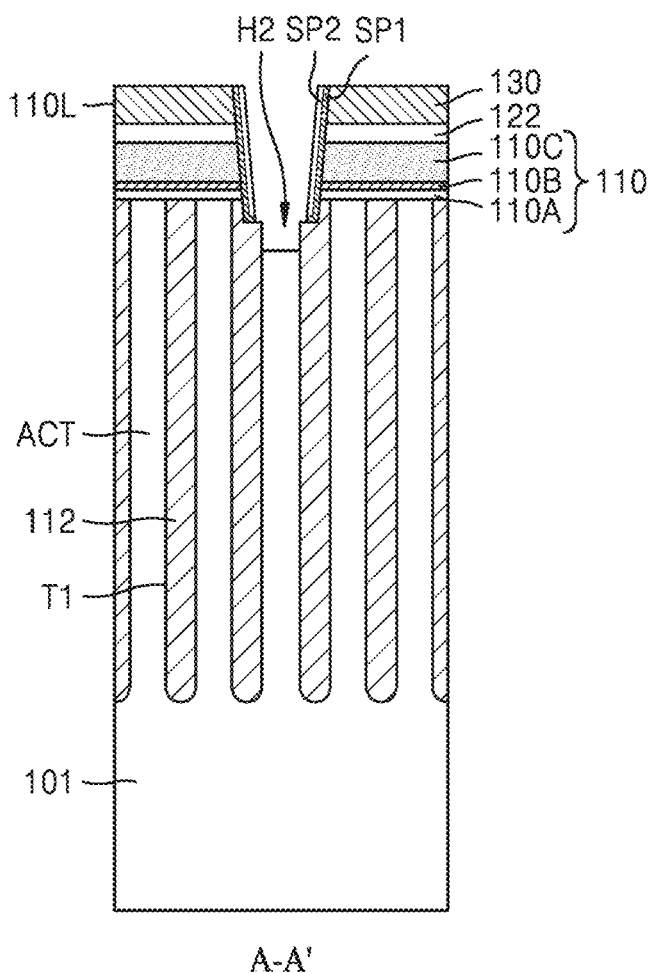
FIGS. 8A and 8B are views illustrating a method of manufacturing an integrated circuit device, according to some example embodiments.
Figure 8B:
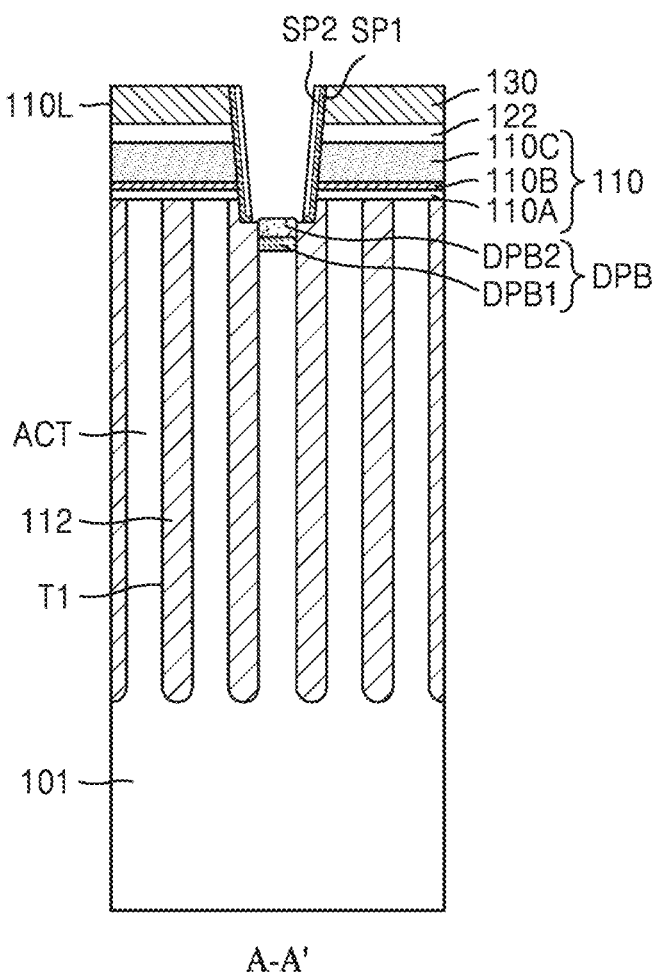

FIGS. 8A and 8B are views illustrating a method of manufacturing an integrated circuit device, according to some example embodiments. FIGS. 8A and 8B illustrate processes after the manufacturing method of FIGS. 4 to 7A.

Referring to FIGS. 3B, 8A, and 8B, after the first hole H1 is formed, a second hole H2 may be formed by an etching process. The second hole H2 may be formed by etching a part of the active region ACT. Next, the first doping contact DPB1 and the second doping contact DPB2 may be formed in the second hole H2. Accordingly, the first doping contact DPB1 and the second doping contact DPB2 may be between the device isolation layers 112.

In various example embodiments, the first doping contact DPB1 and the second doping contact DPB2 may be formed in the second hole H2 by using an epitaxial growth process. A top surface of the second doping contact DPB2 may be higher than a level of the second hole H2 in the vertical direction (the Z direction of FIG. 1). Then, the integrated circuit device 10 having the shape of FIG. 3B may be manufactured by subsequent manufacturing processes of the integrated circuit device 10.

Figure 9A:
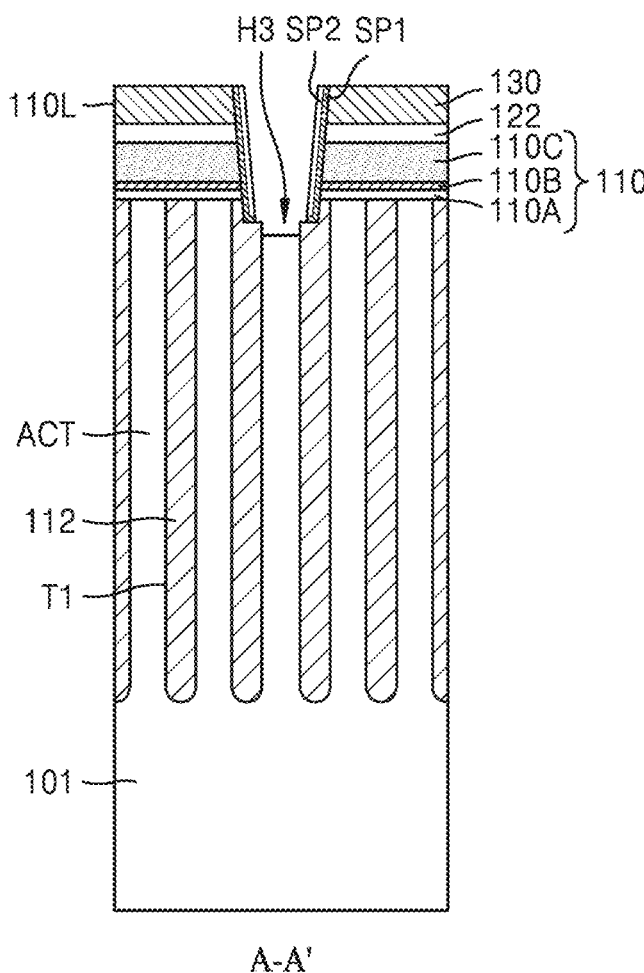
FIGS. 9A and 9B are views illustrating a method of manufacturing an integrated circuit device, according to some example embodiments.
Figure 9B:
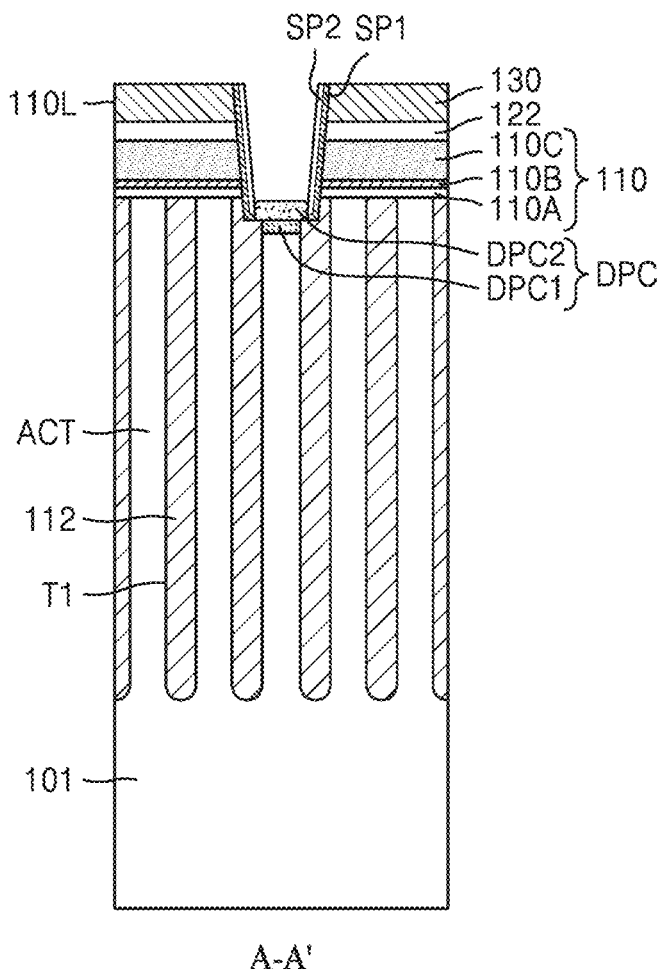

FIGS. 9A and 9B are views illustrating a method of manufacturing an integrated circuit device, according to some example embodiments. FIGS. 9A and 9B illustrate processes after the manufacturing method of FIGS. 4 to 7A.

Referring to FIGS. 3C, 9A, and 9B, after the first hole H1 is formed, a third hole H3 may be formed by an etching process such as but not limited to a dry etching process. The third hole H3 may be formed by etching a part of the active region ACT. Here, the third hole H3 may be etched to a depth less than that of the second hole H2 of FIG. 8A. After the third hole H3 is formed, the first doping contact DPC1 may be formed in the third hole H3. The first doping contact DPC1 may fill the third hole H3. That is, the level of the uppermost surface DPC1T of the first doping contact DPC1 may be the same as that of the lowermost surface SP1B of the first insulating spacer SP1. The second doping contact DPC2 may be formed on the first doping contact DPC1.

In various example embodiments, the first doping contact DPC1 and the second doping contact DPC2 may be formed by using an epitaxial growth process. In some example embodiments, the first doping contact DPC1 may be between the device isolation layers 112, and the second doping contact DPC2 may be surrounded by the first insulating spacer SP1 and the second insulating spacer SP2. Then, the integrated circuit device 10 having the shape of FIG. 3C may be manufactured by subsequent manufacturing processes of the integrated circuit device 10.

As described above, the integrated circuit device according to various example embodiments may reduce resistance between the direct contact DC and the active region ACT by forming the first doping contact DPA1, DPB1, or DPC1 and the second doping contact DPA2, DPB2, or DPC3 between the direct contact DC and the active region ACT. Alternatively or additionally, by forming the first doping contact DPA1, DPB1, or DPC1 under the second doping contact DPA2, DPB2, or DPC3, it may be possible to prevent or reduce phosphorus atoms from excessively diffusing from the second doping contact DPA2, DPB2, or DPC3 into the active region ACT. Accordingly, leakage current in the active region ACT may be prevented or reduced in likelihood of occurrence.

Figure 10:
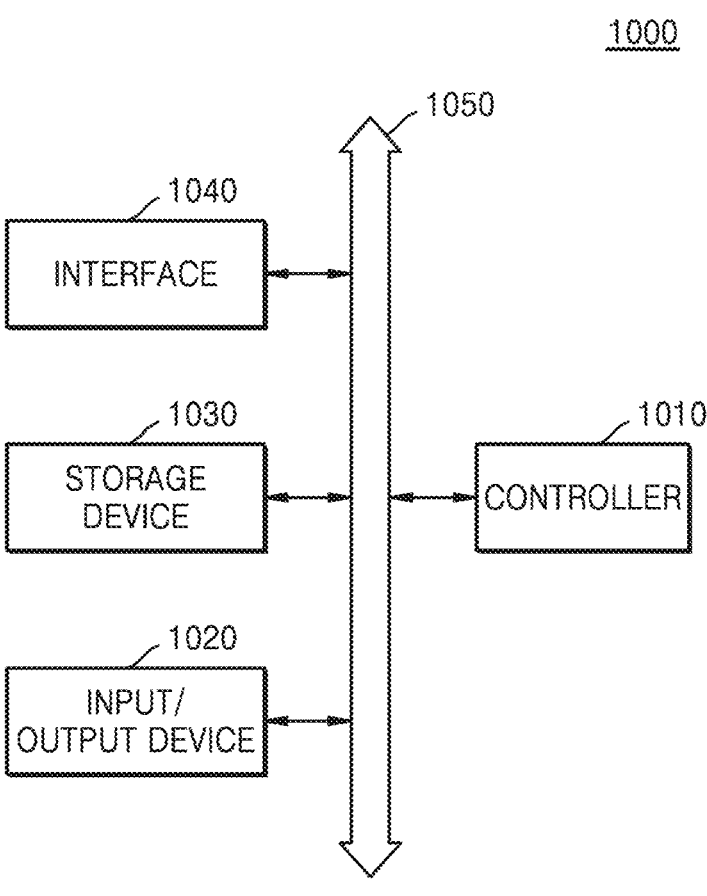
FIG. 10 is a diagram illustrating a system including an integrated circuit device according to some example embodiments.

FIG. 10 is a diagram illustrating a system 1000 including an integrated circuit device according to some example embodiments.

Referring to FIG. 10, the system 1000 includes a controller 1010, an input/output device 1020, a storage device 1030, an interface 1040, and a bus 1050.

The system 1000 may include a mobile system or a system that transmits or receives information. In some example embodiments, the mobile system may include one or more of a portable computer, a web tablet, a mobile phone, a digital music player, or a memory card.

The controller 1010 for controlling an execution program in the system 1000 may include a micro-processor, a digital signal processor, a micro-controller, or a similar device.

The input/output device 1020 may be used to input or output data of the system 1000. The system 1000 may be connected to an external device, for example, a personal computer (PC) or a network, and may exchange data with the external device by using the input/output device 1020. The input/output device 1020 may include, for example, a touch screen, a touch pad, a keyboard, or a display.

The storage device 1030 may store data for an operation of the controller 1010 or may store data processed by the controller 1010. The storage device 1030 may include the integrated circuit device 10 according to the inventive concept described above.

The interface 1040 may be a data transmission path between the system 1000 and the external device. The controller 1010, the input/output device 1020, the storage device 1030, and the interface 1040 may communicate with one another through the bus 1050.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While various example embodiments have been particularly shown and described with reference to embodiments thereof, it will be understood that various changes in form and details may be made therein without departing from the spirit and scope of the following claims. Additionally, example embodiments are not necessarily mutually exclusive with one another. For example, some example embodiments may include one or more features described with reference to one or more figures, and may also include one or more other features described with reference to one or more other figures.

What is claimed is:

1. An integrated circuit device comprising:
a substrate having an active region defined by a device isolation layer;
a word line crossing the active region and extending in the substrate in a first horizontal direction;
a bit line extending on the word line in a second horizontal direction that is orthogonal to the first horizontal direction;
a bit line contact electrically connecting the bit line to the active region;
a doping contact under the bit line contact and connecting the bit line contact to the active region;
a cell pad on the active region and having a horizontal width greater than that of the active region;
a buried contact that digs into one side wall of the cell pad; and
a conductive landing pad extending on the buried contact in a vertical direction and facing the bit line in the first horizontal direction, wherein the doping contact comprises a first doping contact and a second doping contact,
wherein a thickness of the first doping contact in the vertical direction is less than that of the second doping contact in the vertical direction.

2. The integrated circuit device of claim 1, wherein the first doping contact contacts a top surface of the active region, and
the second doping contact is arranged between the bit line contact and the first doping contact.

3. The integrated circuit device of claim 1, wherein a horizontal width of the first doping contact in the first horizontal direction is equal to a horizontal width of the second doping contact in the first horizontal direction.

4. The integrated circuit device of claim 1, wherein the first doping contact includes p-type impurities, and the second doping contact includes n-type impurities.

5. The integrated circuit device of claim 4, wherein a concentration of the p-type impurities of the first doping contact is less than that of the n-type impurities of the second doping contact.

6. The integrated circuit device of claim 1, further comprising:

an insulating spacer surrounding the bit line contact, wherein the insulating spacer contacts the one side wall of the cell pad.

7. The integrated circuit device of claim 6, wherein the insulating spacer comprises a first insulating spacer and a second insulating spacer,
the first insulating spacer covers a lowermost surface of the second insulating spacer and contacts one side wall of the cell pad, and
the second insulating spacer is between the bit line contact and the first insulating spacer.

8. The integrated circuit device of claim 7, wherein the first insulating spacer contacts the first doping contact,
the second insulating spacer partially contacts the bit line contact, the first doping contact, and the second doping contact, and
a level of a lowermost surface of the first doping contact is same as that of a lowermost surface of the first insulating spacer.

9. The integrated circuit device of claim 7, wherein the first doping contact and the second doping contact are apart from the first insulating spacer and the second insulating spacer in the first horizontal direction.

10. The integrated circuit device of claim 7, wherein an uppermost surface of the first doping contact is below a lowermost surface of the first insulating spacer, and
an uppermost surface of the second doping contact is above the lowermost surface of the first insulating spacer.

11. The integrated circuit device of claim 7, wherein a horizontal width of the first doping contact in the first horizontal direction is less than a horizontal width of the second doping contact in the first horizontal direction,
the second doping contact contacts the first insulating spacer and the second insulating spacer,
an uppermost surface of the first doping contact is at a same level as that of the lowermost surface of the first insulating spacer, and
the uppermost surface of the second doping contact is above the lowermost surface of the first insulating spacer.

12. An integrated circuit device comprising:
a substrate having an active region defined by a device isolation layer;
a word line crossing the active region and extending in the substrate in a first horizontal direction;
a bit line extending on the word line in a second horizontal direction that is orthogonal to the first horizontal direction;
a bit line contact electrically connecting the bit line to the active region;
an insulating spacer surrounding a side wall of the bit line contact;
a doping contact arranged under the bit line contact and connecting the bit line contact to the active region;
a cell pad arranged on the active region and having a horizontal width greater than that of the active region;
a buried contact that digs into one side wall of the cell pad; and
a conductive landing pad extending on the buried contact in a vertical direction and facing the bit line in the first horizontal direction, wherein
the doping contact comprises a first doping contact and a second doping contact on the first doping contact,

15 a thickness of the first doping contact in the vertical direction is less than that of the second doping contact in the vertical direction, the insulating spacer comprises a first insulating spacer and a second insulating spacer that dig into the device isolation layer, the first insulating spacer covers a lowermost surface of the second insulating spacer and contacts one side wall of the cell pad, and the second insulating spacer is between the bit line contact and the first insulating spacer.

13. The integrated circuit device of claim 12, wherein the first doping contact includes p-type impurities, the second doping contact includes n-type impurities, and a concentration of the p-type impurities of the first doping contact is less than that of the n-type impurities of the second doping contact.

14. The integrated circuit device of claim 12, wherein a side wall of the first doping contact contacts a side wall of the first insulating spacer and a side wall of the second insulating spacer, a side wall of the second doping contact contacts, the first doping contact contacts a top surface of the active region, the second doping contact is between the bit line contact and the first doping contact, and the lowermost surface of the first insulating spacer at a same level as that of the lowermost surface of the first doping contact.

15. The integrated circuit device of claim 12, wherein the first doping contact and the second doping contact are apart from the first insulating spacer and the second insulating spacer in the first horizontal direction, a side wall of the first doping contact contacts the device isolation layer, and a side wall of the second doping contact contacts the device isolation layer and the bit line contact.

16. The integrated circuit device of claim 15, wherein an uppermost surface of the first doping contact is below the lowermost surface of the cell pad, and a horizontal width of the first doping contact in the first horizontal direction is equal to a horizontal width of the second doping contact in the first horizontal direction.

17. The integrated circuit device of claim 12, wherein an uppermost surface of the first doping contact is at a same level as that of the lowermost surface of the first insulating spacer, the uppermost surface of the second doping contact is below the lowermost surface of the cell pad, and a horizontal width of the second doping contact in the first horizontal direction is greater than a horizontal width of the first doping contact in the first horizontal direction.

18. An integrated circuit device comprising:

a substrate having an active region defined by a device isolation layer;

a word line crossing the active region and extending in the substrate in a first horizontal direction;

16 a bit line extending on the word line in a second horizontal direction orthogonal to the first horizontal direction;

a bit line contact electrically connecting the bit line to the active region;

an insulating spacer surrounding a side wall of the bit line contact;

a doping contact under the bit line contact and connecting the bit line contact to the active region;

a cell pad on the active region and having a horizontal width greater than that of the active region;

a conductive landing pad extending on a buried contact in a vertical direction and facing the bit line in the first horizontal direction;

a capacitor structure on the bit line and electrically connected to the conductive landing pad; wherein the buried contact digs into one side wall of the cell pad and electrically connects the capacitor structure to the active region, the active region is in a form of a bar extending in an oblique direction with respect to the first horizontal direction and the second horizontal direction, the insulating spacer comprises a first insulating spacer and a second insulating spacer that digs into the device isolation layer, the first insulating spacer covers a lowermost surface of the second insulating spacer and contacts one side wall of the cell pad, the second insulating spacer is arranged the bit line contact and the first insulating spacer, the doping contact comprises a first doping contact and a second doping contact, the first doping contact includes p-type impurities, the second doping contact includes n-type impurities, a concentration of the p-type impurities of the first doping contact is less than that of the n-type impurities of the second doping contact, and a thickness of the first doping contact in the vertical direction is less than that of the second doping contact in the vertical direction.

19. The integrated circuit device of claim 18, wherein a horizontal width of the first doping contact in the first horizontal direction and a horizontal width of the second doping contact in the first horizontal direction are greater than a horizontal width of the active region in the first horizontal direction, and at least a part of one side wall of each of the first doping contact and the second doping contact is rounded.

20. The integrated circuit device of claim 19, wherein the first doping contact contacts the bit line contact, and the second doping contact is arranged under the first doping contact, and the first doping contact and the second doping contact do not contact the first insulating spacer and the second insulating spacer.

* * * * *